(12) United States Patent
Obuchi et al.

(10) Patent No.: US 10,026,699 B2
(45) Date of Patent: Jul. 17, 2018

(54) INTEGRATED CIRCUIT CHIP AND INTEGRATED CIRCUIT WAFER WITH GUARD RING

(71) Applicant: Synaptics Japan GK, Tokyo (JP)

(72) Inventors: Atsushi Obuchi, Tokyo (JP); Takashi Yoneoka, Tokyo (JP); Hiroshi Kaga, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/442,207

(22) Filed: Feb. 24, 2017

(65) Prior Publication Data

US 2017/0278805 A1    Sep. 28, 2017

(30) Foreign Application Priority Data

Mar. 24, 2016  (JP) .................................. 2016-059397

(51) Int. Cl.
*H01L 23/552*    (2006.01)
*H01L 23/58*     (2006.01)
(Continued)

(52) U.S. Cl.
CPC ............ *H01L 23/585* (2013.01); *H01L 21/78* (2013.01); *H01L 22/32* (2013.01); *H01L 23/485* (2013.01); *H01L 23/4827* (2013.01); *H01L 24/05* (2013.01); *H01L 24/11* (2013.01); *H01L 24/13* (2013.01); *H01L 23/564* (2013.01); *H01L 2224/0215* (2013.01); *H01L 2224/0219* (2013.01); *H01L 2224/0226* (2013.01); *H01L 2224/02141* (2013.01);
(Continued)

(58) Field of Classification Search
CPC .............................. H01L 23/585; H01L 23/58
See application file for complete search history.

(56) References Cited

U.S. PATENT DOCUMENTS

2005/0127395 A1* 6/2005 Saigoh .................. H01L 23/564
                                                          257/127
2007/0200585 A1* 8/2007 Takeuchi ........... G01R 31/2884
                                                          324/750.3

(Continued)

FOREIGN PATENT DOCUMENTS

JP            2012089668 A    5/2012

*Primary Examiner* — Marc Armand
*Assistant Examiner* — Sarah Salerno
(74) *Attorney, Agent, or Firm* — Patterson + Sheridan, LLP

(57) ABSTRACT

A large scale integrated circuit chip includes a semiconductor circuit having a multilayered wiring structure, a metal guard ring surrounding the semiconductor circuit, and a plurality of external connection terminals, on a semiconductor circuit. The plurality of external connection terminals connect to an uppermost-layer wiring of the multilayered wiring structure and are exposed on a surface of the large scale integrated circuit chip. A predetermined external connection terminal conducts to a predetermined wiring through a conductive via within the guard ring and conducts to a conductive piece through another conductive via outside the guard ring. One side of the external connection terminal extending over the guard ring connects to the conductive piece, and the other side of the external connection terminal connects to the uppermost-layer wiring within the guard ring. Thus, a cutout part is not necessary in the guard ring.

20 Claims, 12 Drawing Sheets

(51) Int. Cl.
*H01L 21/78* (2006.01)
*H01L 21/66* (2006.01)
*H01L 23/482* (2006.01)
*H01L 23/485* (2006.01)
*H01L 23/00* (2006.01)

(52) U.S. Cl.
CPC ........... *H01L 2224/02181* (2013.01); *H01L 2224/02251* (2013.01); *H01L 2224/03826* (2013.01); *H01L 2224/03912* (2013.01); *H01L 2224/03914* (2013.01); *H01L 2224/0401* (2013.01); *H01L 2224/05082* (2013.01); *H01L 2224/05096* (2013.01); *H01L 2224/05124* (2013.01); *H01L 2224/1146* (2013.01); *H01L 2224/1147* (2013.01); *H01L 2224/13144* (2013.01); *H01L 2924/04941* (2013.01)

(56) References Cited

U.S. PATENT DOCUMENTS

| | | | |
|---|---|---|---|
| 2009/0315184 A1* | 12/2009 | Tokitoh | H01L 23/522 257/758 |
| 2010/0295044 A1* | 11/2010 | Homma | H01L 22/32 257/48 |
| 2012/0007211 A1* | 1/2012 | Aleksov | H01L 22/32 257/508 |
| 2012/0018726 A1 | 1/2012 | Nakagawa et al. | |

* cited by examiner

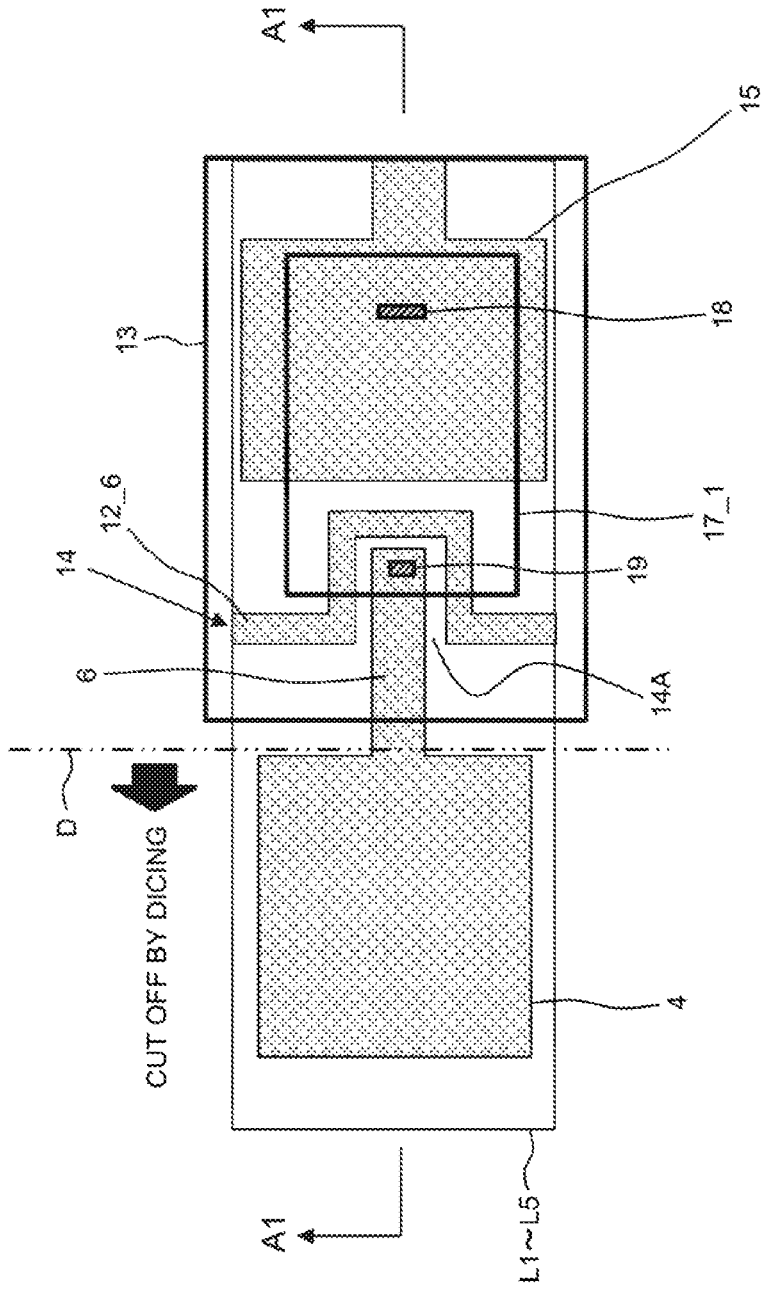

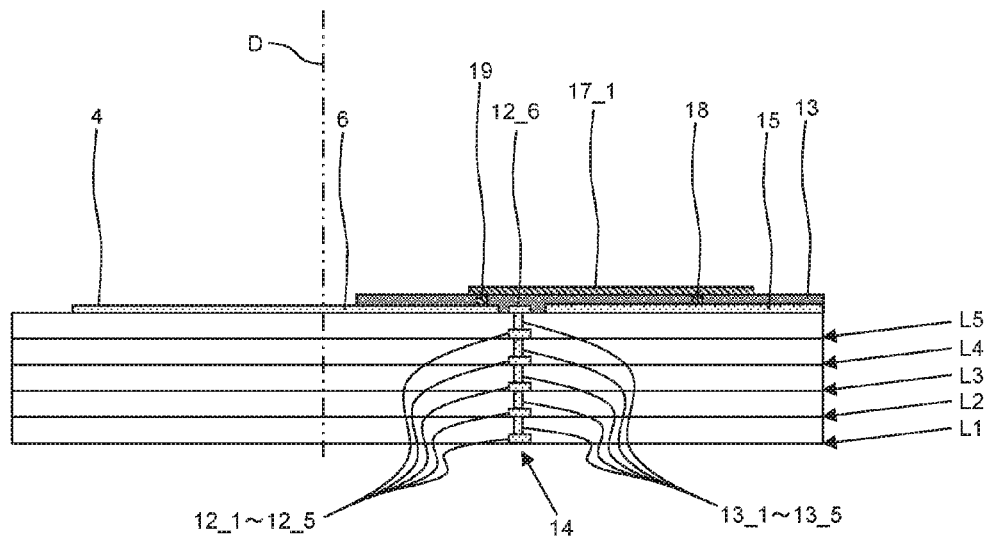
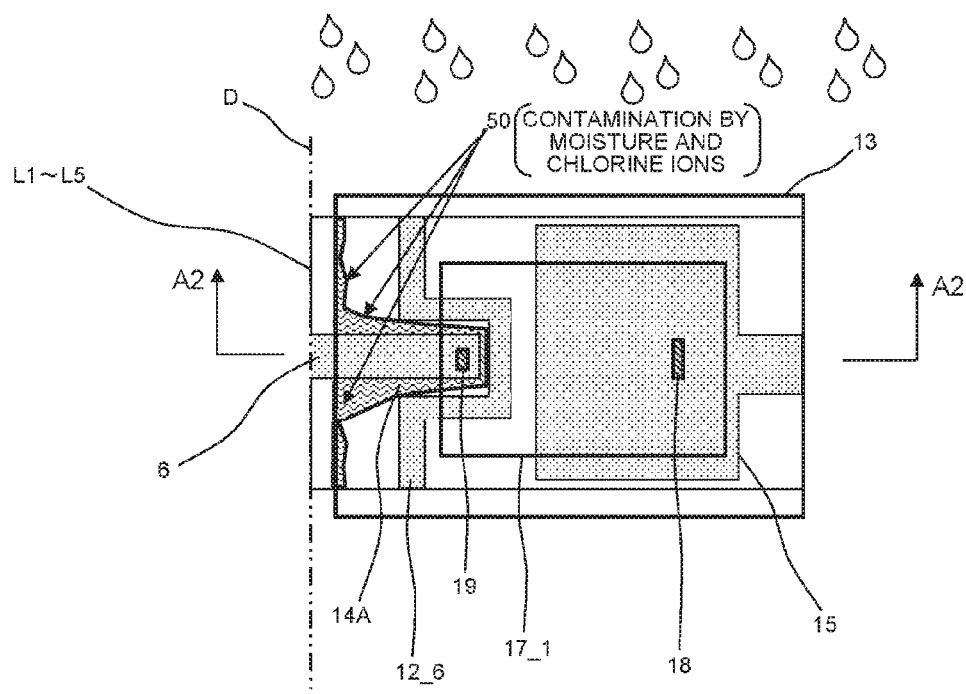

A2-A2 CROSS SECTION

CDEF CROSS SECTION

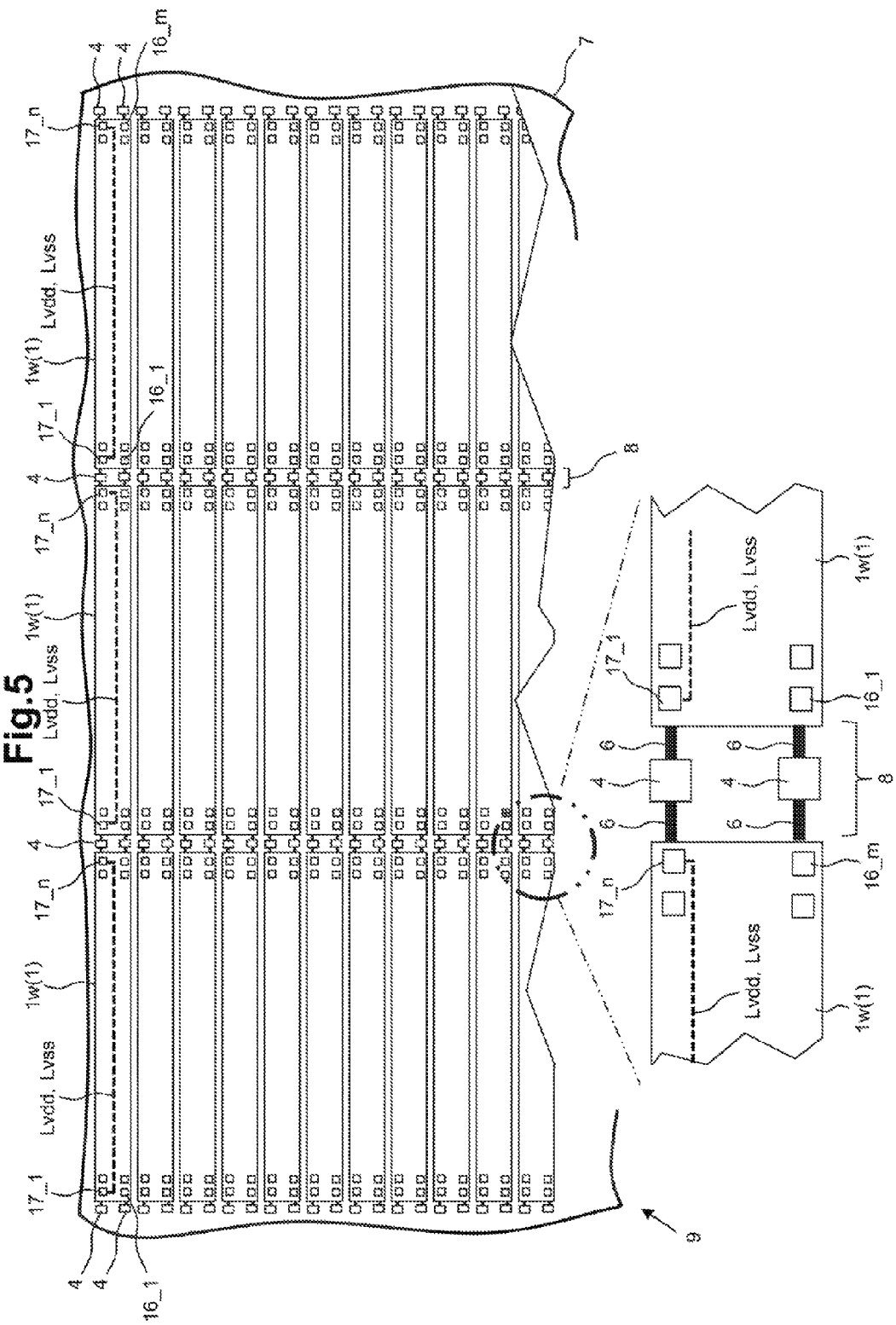

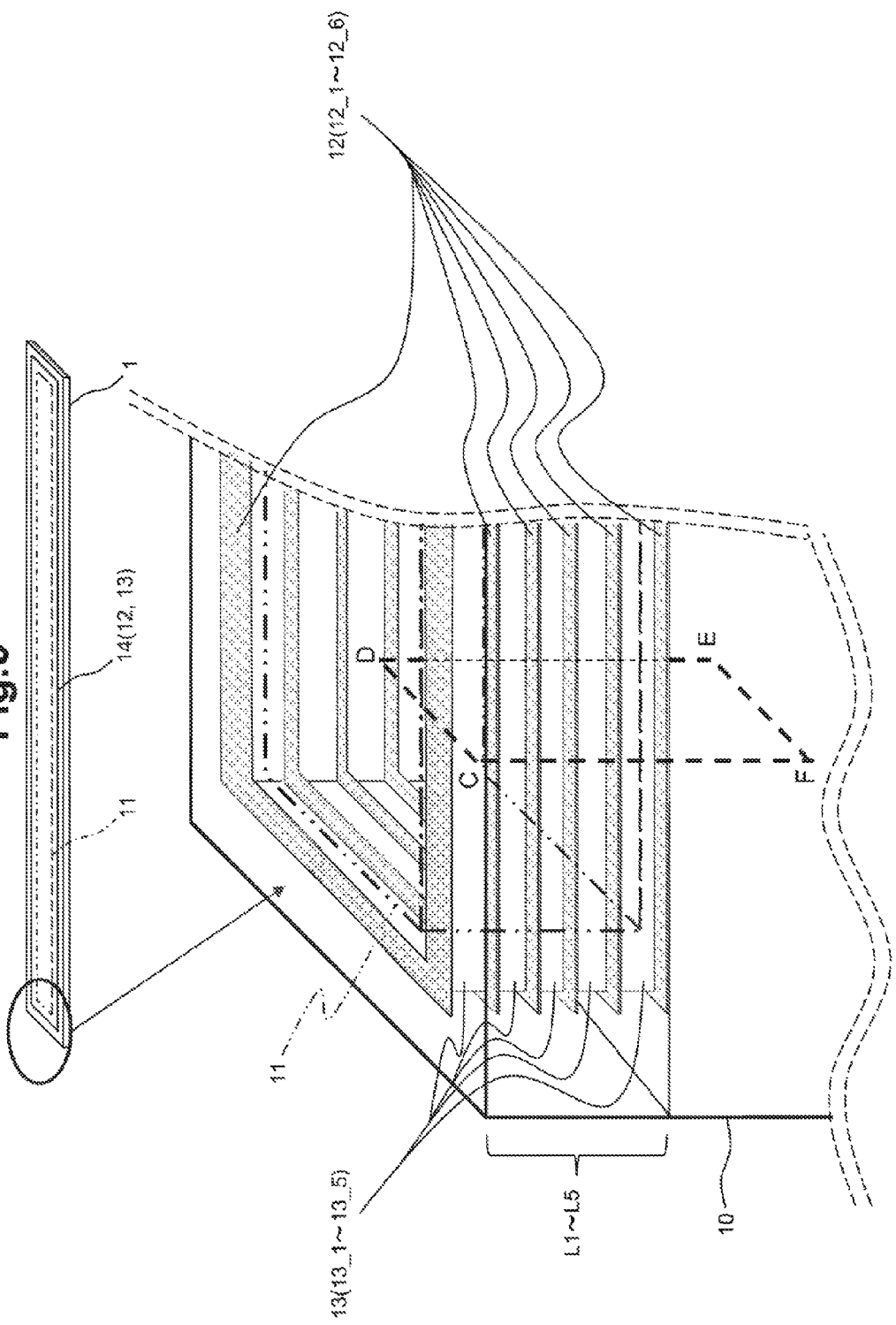

B2-B2 CROSS SECTION

INTEGRATED CIRCUIT CHIP AND INTEGRATED CIRCUIT WAFER WITH GUARD RING

CROSS-REFERENCE TO RELATED APPLICATIONS

The present application claims priority from Japanese application JP 2016-059397 filed on Mar. 24, 2016, the content of which is hereby incorporated by reference into this application.

BACKGROUND

Embodiments described herein relate to a structure for preventing contamination from a cut surface of dicing in a large scale integrated circuit chip and also relates to a large scale integrated circuit wafer that is mounted with a plurality of such large scale integrated circuit chips. In particular, the disclosure relates to a technique that can be effectively used in a display driver IC, for example.

Wafers such as silicon wafers are formed with a great number of chip forming regions by a specific semiconductor integrated circuit producing process, such as by a CMOS integrated circuit producing technology. Dicing regions are formed between the chip forming regions, and the chip forming regions are cut apart at the dicing regions into pieces to be used as large scale integrated circuit chips.

The large scale integrated circuit chips are usually inspected in the condition of being mounted on a large scale integrated circuit wafer before they are cut apart into pieces. To efficiently perform the inspection, external connection terminals that have the same function and that are formed in the respective chip forming regions may be commonly connected between the chip forming regions by test wirings provided in the dicing regions. The test wirings connect to test pads for signals or test pads for power source in the dicing regions. Thus, by pressing terminals of a test probe against the test pads, the large scale integrated circuits in the chip forming regions are inspected per wafer. Such test wirings and test pads are disclosed in WO 2010/110233, for example.

Dicing a large scale integrated circuit wafer may generate a crack due to stress that concentrates around a chip forming region. The crack that is generated around the periphery of the large scale integrated circuit chip facilitates entering of moisture from the outside. In view of this, as disclosed in JP-A-2012-89668, a guard ring (moisture resistant ring) may be provided to an outer periphery of a chip forming region so that entering of moisture can be prevented.

SUMMARY

A large scale integrated circuit chip includes a semiconductor substrate and a semiconductor circuit formed above the semiconductor substrate and having a vertically multilayered wiring structure. The integrated circuit chip also includes a metal guard ring formed above the semiconductor substrate and surrounding the semiconductor circuit, and a plurality of external connection terminals connecting to a predetermined wiring of the multilayered wiring structure of the semiconductor circuit and exposed on a surface of the large scale integrated circuit chip. A predetermined external connection terminal among the plurality of external connection terminals conducts to the predetermined wiring through a conductive via within the guard ring and conducts to a conductive piece through another conductive via outside the guard ring. The conductive piece is a piece of a test lead-out wiring and is a wiring having a cut surface that is exposed by dicing.

A large scale integrated circuit wafer includes a semiconductor wafer and a plurality of chip forming regions arranged on the semiconductor wafer so as to be mutually separated. Each of the chip forming regions includes a semiconductor circuit, a metal guard ring, and plurality of external connection terminals. The semiconductor circuit is formed above the semiconductor wafer and has a vertically multilayered wiring structure. The metal guard ring is formed above the semiconductor wafer and surrounds the semiconductor circuit. The plurality of external connection terminals connect to a predetermined wiring of the multilayered wiring structure of the semiconductor circuit and are exposed on a surface of the large scale integrated circuit wafer. The large scale integrated circuit wafer also includes dicing regions formed between the plurality of chip forming regions. The dicing regions have a plurality of test pads. A plurality of predetermined external connection terminals among the plurality of external connection terminals in the chip forming regions have the same function, and each of the predetermined external connection terminals conducts to the predetermined wiring through a conductive via within the guard ring and connects to a test lead-out wiring, which is drawn out from the test pad, through another conductive via outside the guard ring.

INTRODUCTION

JP-A-2012-89668 has been made from a viewpoint of reducing generation of cracks by forming a stress absorbing pattern in a dicing region outside a guard ring. The disclosure describes preventing entering of moisture from an end surface and the like. The end surface is formed and exposed by cutting a test wiring in dicing. The test wiring is formed in a dicing region and connects to a test pad. A piece of the cut test wiring conducts to a semiconductor circuit that is formed on a large scale integrated circuit chip having been subjected to the dicing. Accordingly, in a case of using such a structure that a guard ring surrounds a periphery of a semiconductor circuit, a part of the guard ring usually needs to be cut off so that the piece of the test wiring can run therethrough to conduct the piece of the test wiring to the inside of the semiconductor circuit and to perform an inspection of a wafer.

However, when a part of the guard ring is cut off, moisture-proof performance is degraded at the cutout part, and contamination of the integrated circuit due to moisture and ions can occur undesirably.

An object of an embodiment is to provide a large scale integrated circuit chip having a guard ring of which moisture-proof performance is not degraded even though a conductive piece connecting to an inside of a semiconductor circuit is exposed at an end surface that is made by dicing or at another part. Another object of an embodiment is to provide a large scale integrated circuit wafer suitable for obtaining such a large scale integrated circuit chip. The above and other objects and features of the disclosure will be clearly understood from descriptions in this specification and attached drawings.

Summary of representative embodiments in this application will be described briefly below. Here, reference numerals, which appear in the drawings, are described in parentheses in the following items as examples for facilitating understanding of the disclosure.

[1] Separate an uppermost-layer wiring within a guard ring from a test lead-out wiring outside the guard ring by the guard ring A large scale integrated circuit chip (1) includes a semiconductor substrate (10), a semiconductor circuit (11) formed above the semiconductor substrate and having a vertically multilayered wiring structure, a metal guard ring (14) formed above the semiconductor substrate and surrounding the semiconductor circuit, and a plurality of external connection terminals (17_1 to 17_n) connecting to a predetermined wiring (15) of the multilayered wiring structure of the semiconductor circuit and exposed on a surface of the large scale integrated circuit chip. A predetermined external connection terminal (17_1) of the plurality of external connection terminals conducts to the predetermined wiring through a conductive via (18) within the guard ring and conducts to a conductive piece (6) through another conductive via (19) outside the guard ring. The conductive piece is a piece of a test lead-out wiring (6) and is a wiring having a cut surface that is exposed by dicing.

According to the item 1, one side of the external connection terminal, which extends over the guard ring, connects to the conductive piece, and the other side of the external connection terminal connects to the wiring within the guard ring. Thus, forming a cutout part at apart of the guard ring is not necessary. Accordingly, the moisture-proof performance of the guard ring is not degraded even though the conductive piece connecting to the inside of the semiconductor circuit is exposed at an end surface made by dicing or at another part. The conductive piece is provided to be used for collectively inspecting a plurality of semiconductor circuits on a wafer before the wafer is diced.

[2] External connection terminals made of a noble metal wiring material and conductive piece made of an aluminum wiring material In the item 1, the external connection terminals may be made of a noble metal wiring material, and the conductive piece and the guard ring may be made of an aluminum wiring material.

According to the item 2, even when contamination develops to the conductive piece and the conductive via at the outside of the guard ring, the external connection terminals made of the noble metal wiring material are not greatly affected, and the moisture-proof performance is still maintained.

[3] The piece enters into an indent part that inwardly indents from the outside to the inside of the guard ring In the item 2, the conductive piece may enter into an indent part that inwardly indents from the outside to the inside of the guard ring and may connect to the predetermined external connection terminal through the other conductive via at a position overlapping the predetermined external connection terminal in a vertical direction.

According to the item 3, extending of the predetermined external connection terminal to the outside of the guard ring in a plan view is not necessary.

[4] Conductive piece being a part of a wiring that extended from a test pad in a dicing region In the item 2, the conductive piece may be a wiring that extended from a test pad (4) formed in a dicing region having been subjected to dicing.

According to the item 4, the conductive piece connecting to the test pad allows collective inspection of semiconductor circuits on a wafer before the wafer is diced.

[5] Guard ring of which closed-circuit wirings surrounding the semiconductor circuit are connected to each other between adjacent wiring layers by conductive circumferential vias In the item 2, the guard ring may be formed of closed-circuit wirings (12_1 to 12_6) and conductive circumferential vias (13_1 to 13_5). The closed-circuit wirings form closed circuits and are arranged at respective wiring layers of the multilayered wiring structure overlappingly in a vertical direction so as to surround an outside of the semiconductor circuit. The circumferential vias vertically and mutually connect the closed-circuit wirings of the wiring layers, which are adjacent to each other in the vertical direction.

According to the item 5, the guard ring is formed in a wall-like shape on the semiconductor substrate by the closed-circuit wiring and the circumferential via of each of the wiring layers.

[6] Separate an uppermost-layer wiring within a guard ring from a test lead-out wiring outside the guard ring by the guard ring A large scale integrated circuit wafer (9) includes a semiconductor wafer (7), a plurality of chip forming regions (1w) are arranged on the semiconductor wafer so as to be mutually separated, and dicing regions (8) that are respectively formed between the chip forming regions. Each of the chip forming regions includes a semiconductor circuit (11), a metal guard ring (14), and a plurality of external connection terminals (17_1 to 17_n). The semiconductor circuit is formed above the semiconductor wafer and has a vertically multilayered wiring structure. The metal guard ring is formed above the semiconductor wafer and surrounds the semiconductor circuit. The plurality of external connection terminals connect to a predetermined wiring (15) of the multilayered wiring structure of the semiconductor circuit and are exposed on a surface of the large scale integrated circuit wafer. The dicing regions have a plurality of test pads (4). A plurality of predetermined external connection terminals (17_1) among the plurality of external connection terminals in the chip forming regions has the same function. Each of the predetermined external connection terminals conducts to the predetermined wiring through a conductive via (18) within the guard ring and connects to a test lead-out wiring (6), which is drawn out from the test pad, through another conductive via (19) outside the guard ring.

According to the item 6, one side of the external connection terminal, which extends over the guard ring, connects to the conductive piece, and the other side of the external connection terminal connects to the wiring within the guard ring. Thus, forming a cutout part at apart of the guard ring is not necessary. Accordingly, the moisture-proof performance of the guard ring is not degraded even though the test lead-out wiring is exposed at a cut surface by dicing after the wafer is inspected.

[7] External connection terminals made of a noble metal wiring material and conductive pieces made of an aluminum wiring material In the item 6, the external connection terminals may be made of a noble metal wiring material, and the conductive pieces and the guard rings may be made of an aluminum wiring material.

According to the item 7, even when contamination develops to the conductive piece and the conductive via at the outside of the guard ring, the external connection terminals made of the noble metal wiring material are not greatly affected, and the moisture-proof performance is still maintained.

[8] Supply common signals and the like from one test pad to a plurality of chip forming regions that are arranged in parallel In the item 7, the predetermined external connection terminals having the same function may conduct to each other in the corresponding chip forming region (Lvdd, Lvss). At least three chip forming regions may be arranged along one direction so that the dicing region is interposed between each two of the at least three chip forming regions on the semiconductor wafer. The test lead-out wiring may be drawn out from the test pad, which is formed in the dicing region, toward the chip forming region at each side of the dicing region and may connect to one of the predetermined external connection terminals, which are formed in the chip forming region at each side of the dicing region and have the same function.

According to the item 8, the predetermined external connection terminals having the same function conduct to each other in the corresponding chip forming region, thereby contributing to reduction in the number and the length of the test lead-out wirings that are to be arranged in the dicing regions. Moreover, a signal or power is commonly supplied from one test pad to the predetermined external connection terminals in the plurality of chip forming regions, which are arranged in parallel so that the dicing region is interposed between the chip forming regions. Accordingly, the number of terminals of test probes, which are to be pushed against the test pads on a wafer before the wafer is diced, is reduced. In other words, increase in the number of the terminals of the test probes is avoided regardless of increase in the number of the external connection terminals in one chip forming region.

[9] The predetermined external connection terminals used for power source or ground In the item 8, the predetermined external connection terminals may be power source terminals or ground terminals.

According to the item 9, the effects of the item 8 are obtained in providing power or ground connection.

[10] The piece enters into an indent part that inwardly indents from the outside to the inside of the guard ring In the item 7, each of the test lead-out wirings may enter into an indent part that inwardly indents from the outside to the inside of the guard ring and may connect to the predetermined external connection terminal through the conductive via at a position overlapping the predetermined external connection terminal in a vertical direction.

According to the item 10, extending of the predetermined external connection terminals to the outside of the guard ring in a plan view is not necessary.

[11] Guard ring of which closed-circuit wirings surrounding the semiconductor circuit are connected to each other between adjacent wiring layers by conductive circumferential vias In the item 7, the guard ring may be formed of closed-circuit wirings (12_1 to 12_6) and conductive circumferential vias (13_1 to 13_5). The closed-circuit wirings form closed circuits and are arranged at respective wiring layers of the multilayered wiring structure overlappingly in a vertical direction so as to surround an outside of the semiconductor circuit. The circumferential vias vertically and mutually connect the closed-circuit wirings of the wiring layers, which are adjacent to each other in the vertical direction.

According to the item 11, the guard ring is formed in a wall-like shape on the semiconductor substrate by the closed-circuit wiring and the circumferential via of each of the wiring layers.

The effects that are obtained by the typical embodiments disclosed in this application are briefly described as follows.

That is, the moisture-proof performance of the guard ring is not degraded even though the conductive piece connecting to the inside of the semiconductor circuit is exposed at an end surface made by dicing.

BRIEF DESCRIPTION OF THE DRAWINGS

FIG. 1 is a plan view showing an uppermost-layer wiring within a guard ring and a test lead-out wiring outside the guard ring, which are separated by the guard ring.

FIG. 2 is a sectional view taken along a line A1-A1 in FIG. 1.

FIG. 3 is a plan view showing the test lead-out wiring that is exposed at a side surface of a chip by dicing from the condition shown in FIG. 1.

FIG. 5 is a plan view schematically showing a part of a large scale integrated circuit wafer.

FIG. 6 is a perspective view showing an example of a structure of the guard ring.

DETAILED DESCRIPTION

Figure 4:
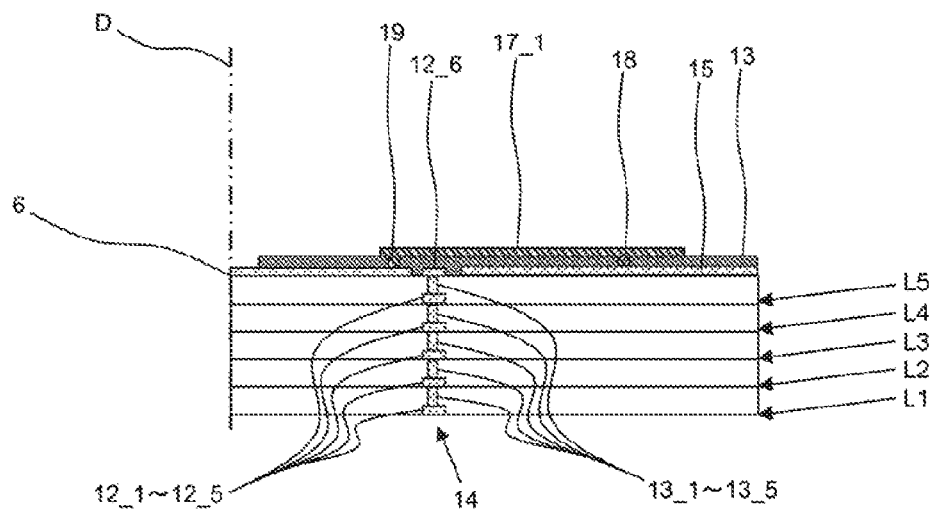
FIG. 4 is a sectional view taken along a line A2-A2 in FIG. 3.

FIG. 5 shows a part of a large scale integrated circuit wafer 9 according to an embodiment. As shown in FIG. 5, the large scale integrated circuit wafer 9 includes a semiconductor wafer 7 on which a plurality of chip forming regions 1*w* are arranged in matrix so as to be separated from each other. Dicing regions 8 are formed between the chip forming regions 1*w*. The chip forming regions 1*w* are subjected to dicing after the large scale integrated circuit wafer 9 is inspected to thereby obtain large scale integrated circuit chips 1. The semiconductor wafer 7 is formed in a circular shape in practical use and is made of single crystal silicon, for example. As shown in FIG. 6, the semiconductor wafer 7 is also called a semiconductor substrate 10 in the large scale integrated circuit chip 1. The usage of the chip forming regions 1*w* is not limited to a specific object. Here, the chip forming regions 1*w* are made as display driver ICs for driving liquid crystal panel displays. Each of the chip forming regions 1*w* has a long shape, and a great number of external connection terminals 16_1 to 16_*m* and 17_1 to 17_*n* are arranged along the long sides of the respective chip forming regions. The external connection terminals 17_1 to 17_*n*, which are arranged along one of the long sides of the chip forming region 1*w*, may be respectively used as a source driving terminal, a gate control signal terminal, a display synchronizing signal terminal, a power source terminal, and a ground terminal for a liquid crystal panel. The external connection terminals 16_1 to 16_*m*, which are arranged along the other long side of the chip forming region 1*w*, may be used as terminals for a host interface.

Each of the chip forming regions 1*w* includes a semiconductor circuit 11 and a metal guard ring 14, as shown in FIG. 6. The semiconductor circuit 11 has desired circuit elements, such as a MOS transistor and a capacitive element, and a vertically multilayered wiring structure above the semiconductor wafer 7. The guard ring 14 is also formed above the semiconductor wafer 7 and surrounds the semiconductor circuit 11.

Circuit elements are formed on a main surface of the semiconductor wafer 7 and are connected to multilayered wirings as desired, and thus, the semiconductor circuit 11 has a necessary circuit function, for example, a display controlling function that is necessary for the display driver IC. Although not limited to a specific structure, the multi-layered wiring structure may be a five-layered wiring structure in which wiring layers L1 to L5 are stacked above the circuit elements. In this case, each of the wiring layers has a desired wiring pattern for constituting wiring to connect the circuit elements. The wiring of each of the wiring layers is, for example, aluminum wiring, and is insulated by an interlayer insulating film. A publicly known production technology for a CMOS integrated circuit can be applied to the device structure and the production method for the circuit elements and the wiring layers L1 to L5 in the semiconductor circuit 11, and therefore, detailed description thereof will be omitted.

Figure 7:
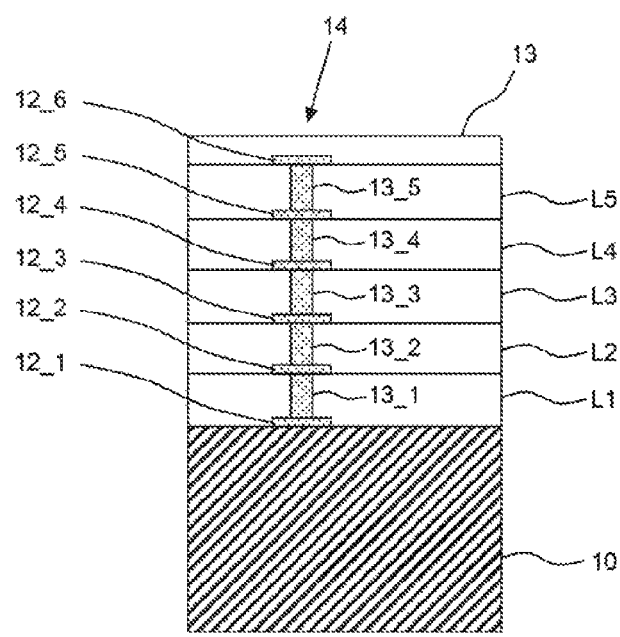
FIG. 7 is a sectional view taken along a CDEF plane in FIG. 6.

The guard ring 14 is formed of closed-circuit wirings 12_1 to 12_6 and conductive circumferential vias 13_1 to 13_5, as shown in FIG. 6. The closed-circuit wirings 12_1 to 12_6 form closed circuits and are arranged at the respective wiring layers L1 to L5 of the multilayered wiring structure overlappingly in a vertical direction so as to surround an outside of the semiconductor circuit 11. The circumferential vias 13_1 to 13_5 vertically and mutually connect the closed-circuit wirings 12_1 to 12_6 of the wiring layers, which are adjacent to each other in the vertical direction. The guard ring 14 forms a wall that surrounds the semiconductor circuit 11. The closed-circuit wirings 12_1 to 12_6 are made of, for example, the same aluminum wiring material as that of the other wirings. The circumferential vias 13_1 to 13_5 are made of, for example, the same aluminum wiring material as that of the other vias. The guard ring 14 has a vertical sectional structure as shown in FIG. 7, and FIG. 7 is a sectional view taken along a CDEF plane in FIG. 6. The guard ring 14 can be produced by a publicly known production method, such as one disclosed in JP-A-2012-89668.

The dicing regions 8 have a plurality of test pads 4, as exemplified in FIG. 5. The positions of the test pads 4 are not limited to specific positions, but the test pads 4 may be arranged in the dicing regions 8 that are adjacent to short sides of the chip forming regions 1*w*. Each of the test pads 4 has a test lead-out wiring 6 at each side, and the test lead-out wirings 6 extend to the chip forming regions 1*w*. The test lead-out wirings 6 can connect to any terminals. For example, one of the test lead-out wirings 6 at both sides of the test pad 4 connects to the external connection terminal 17_1 in the chip forming region 1*w* on the right side in FIG. 5, and the other test lead-out wiring 6 connects to the external connection terminal 17_*n* in the chip forming region 1*w* on the left side in FIG. 5. The external connection terminals 17_1 and 17_*n* in the chip forming region 1*w* are conducted by a power source wiring Lvdd or a ground wiring Lvss within the chip forming region 1*w*. Thus, as clearly shown in FIG. 5, the plurality of chip forming regions that are arranged in a line in the lateral direction are supplied with power source or are grounded through one of the test pads 4 that are arranged in the same line. It is not necessary to supply power source or ground connection to each of the chip forming regions 1*w* through the respective test pads 4. That is, the test pads 4 are useful for collectively inspecting the semiconductor circuits 11 in the plurality of chip forming regions 1*w*.

One embodiment has a feature in the structure in which the test pad 4 is connected to the predetermined external connection terminal 17_1 without cutting apart of the guard ring 14. The structure of the connecting part therebetween in a plan view is shown in FIG. 1, and a cross section taken along a line A1-A1 in FIG. 1 is shown in FIG. 2. As shown in FIGS. 1 and 2, the external connection terminal 17_1 conducts to a predetermined uppermost-layer wiring 15 through a conductive via 18 within the guard ring 14 and also conducts to the test lead-out wiring 6, which is drawn out from the test pad 4, through a conductive via 19 outside the guard ring 14. Each of the predetermined uppermost-layer wiring 15, the test pad 4, and the test lead-out wiring 6 is formed on an uppermost wiring layer by using an aluminum wiring material, for example. The conductive via 19 is positioned outside the guard ring 14 in a plan view. That is, the test lead-out wiring 6 connects to the external connection terminal 17_1 through the conductive via 19 at a position overlapping the external connection terminal 17_1 in the vertical direction such that the test lead-out wiring 6 enters into an indent part 14A, which inwardly indents from the outside to the inside of the guard ring 14. The left side from a cut line D shown in FIGS. 1 and 2 is cut off by dicing. Thus, the test lead-out wiring 6 is cut at an intermediate part thereof and is exposed at a side surface of the large scale integrated circuit chip 1. FIG. 3 shows the test lead-out wiring 6 that is exposed at the side surface of the chip by dicing from the condition shown in FIG. 1. FIG. 4 shows a cross section taken along a line A2-A2 in FIG. 3. It should be noted that a passivation film for covering the large scale integrated circuit wafer except for the test pad 4 and the external connection terminal 17 is not shown in FIGS. 1 and 3.

Figure 8:
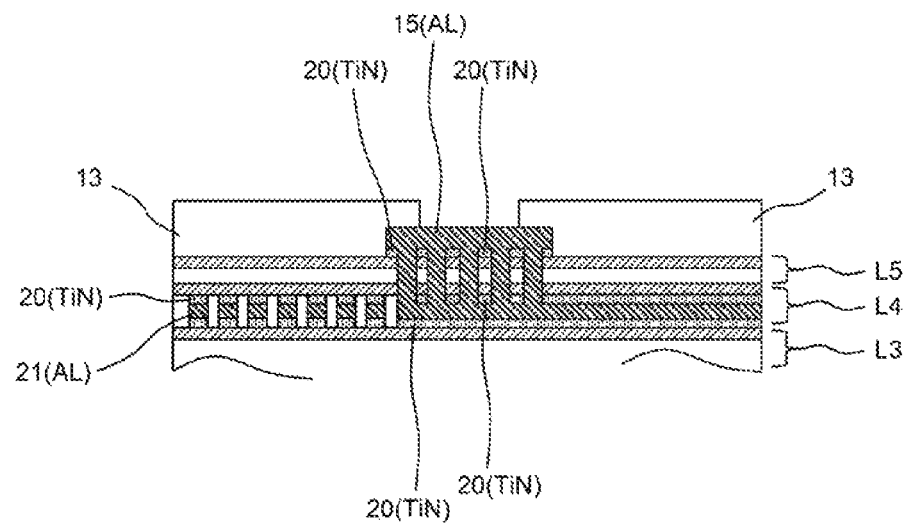
FIG. 8 is a vertical sectional view showing a part of the large scale integrated circuit wafer before a gold bump is formed.
Figure 9:
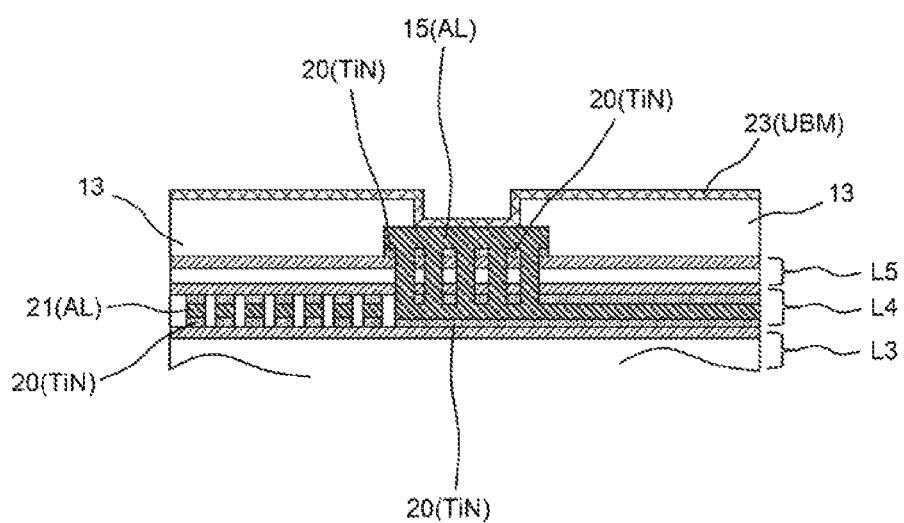
FIG. 9 is a vertical sectional view showing the part of the large scale integrated circuit wafer of which surface is sputtered to form a UBM in the condition shown in FIG. 8.
Figure 10:
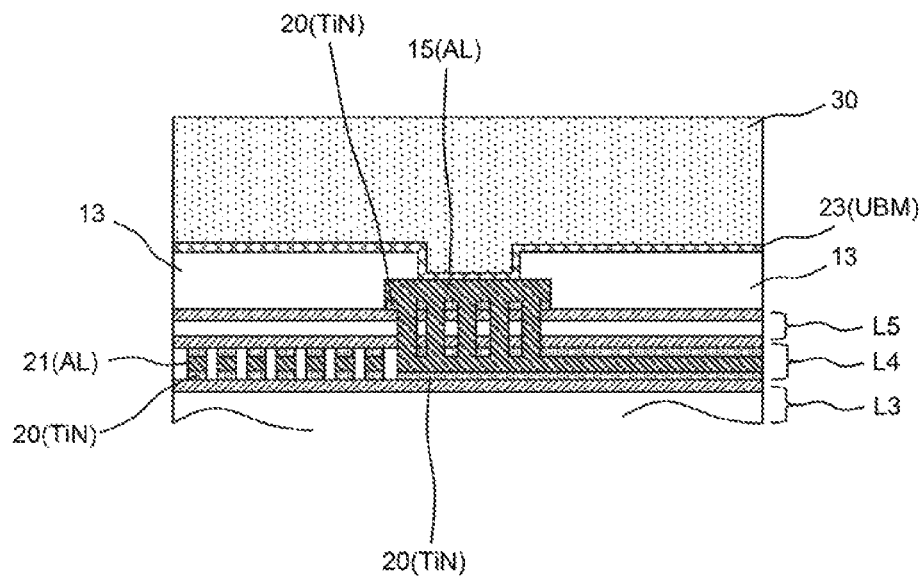
FIG. 10 is a vertical sectional view showing the part of the large scale integrated circuit wafer of which surface is coated with a photoresist in the condition shown in FIG. 9.
Figure 11:
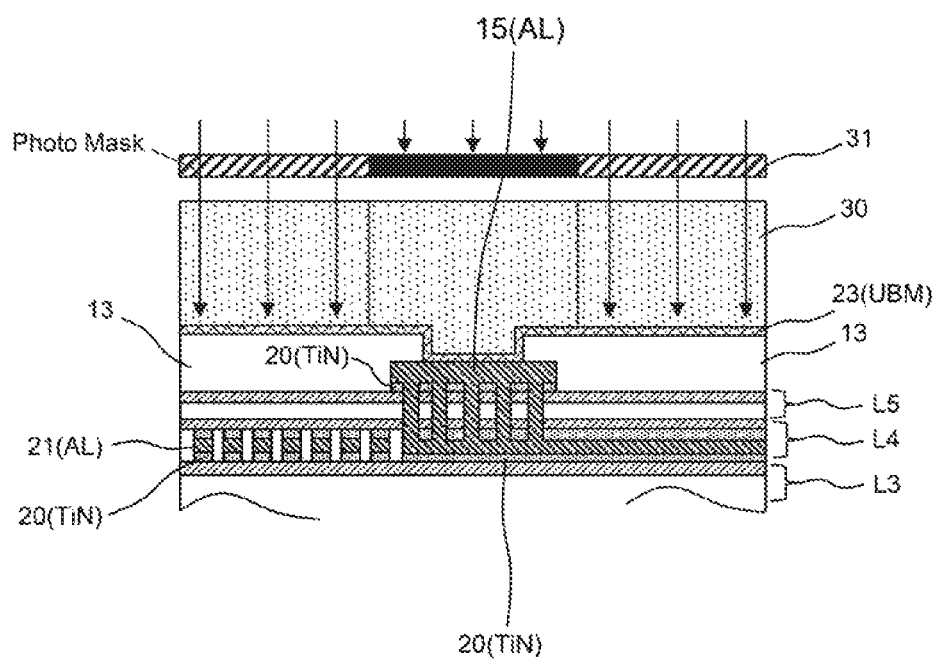
FIG. 11 is a vertical sectional view showing an exposure step performed on the part of the large scale integrated circuit wafer in the condition shown in FIG. 10.
Figure 12:
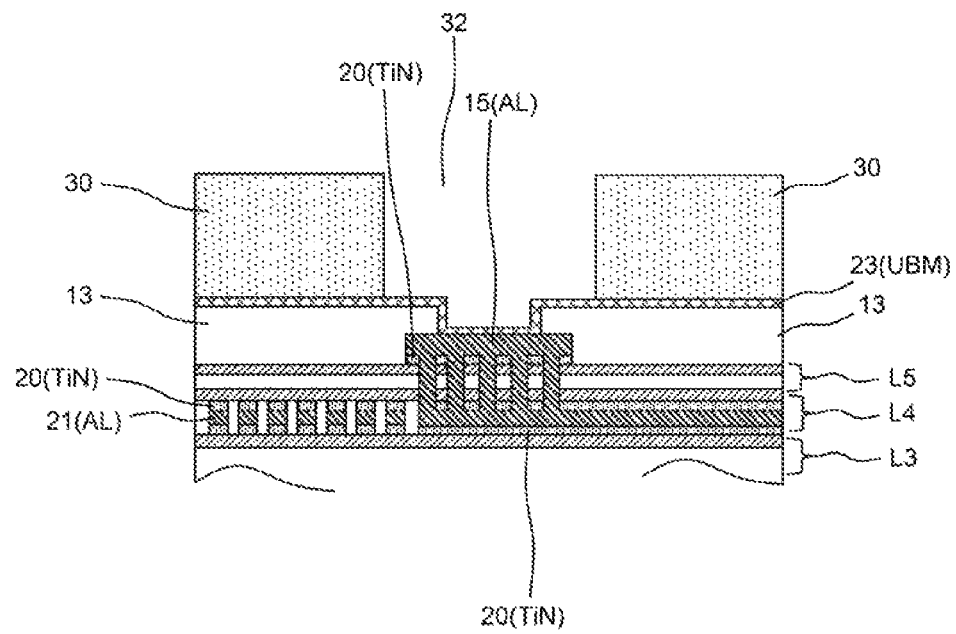
FIG. 12 is a vertical sectional view showing the part of the large scale integrated circuit wafer that is developed in the condition shown in FIG. 11.
Figure 13:
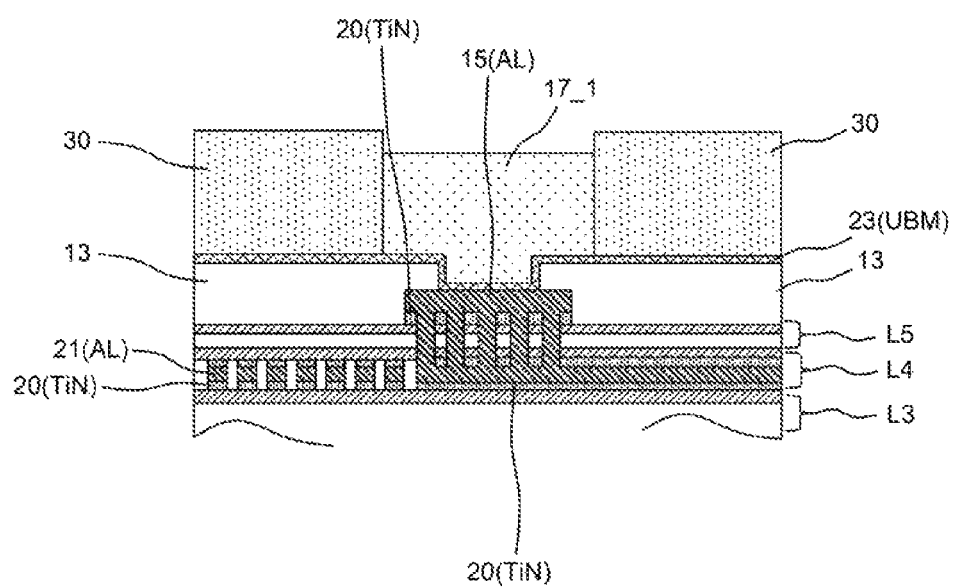
FIG. 13 is a vertical sectional view showing the part of the large scale integrated circuit wafer that is plated with gold in the condition shown in FIG. 12.
Figure 14:
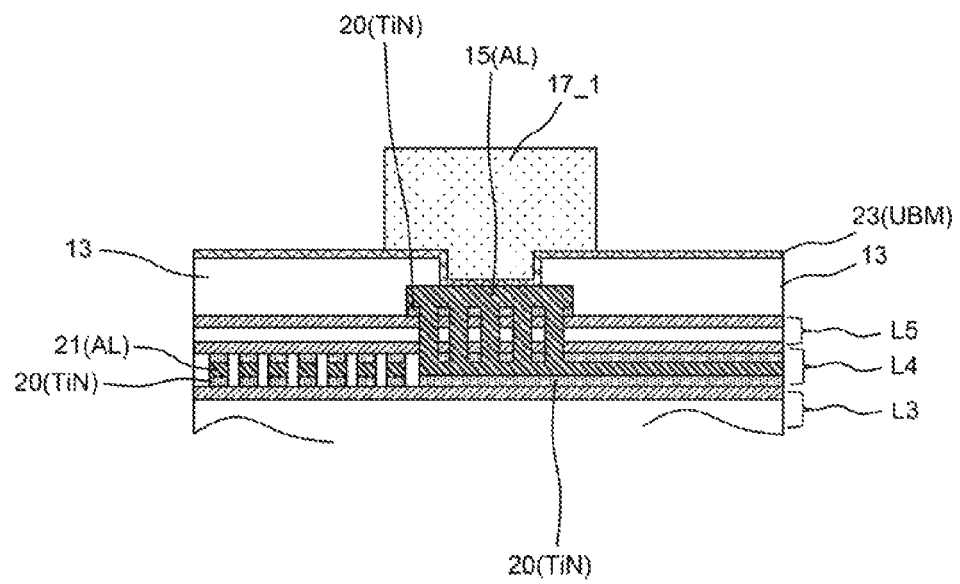
FIG. 14 is a vertical sectional view showing the part of the large scale integrated circuit wafer from which the photoresist is removed in the condition shown in FIG. 13.
Figure 15:
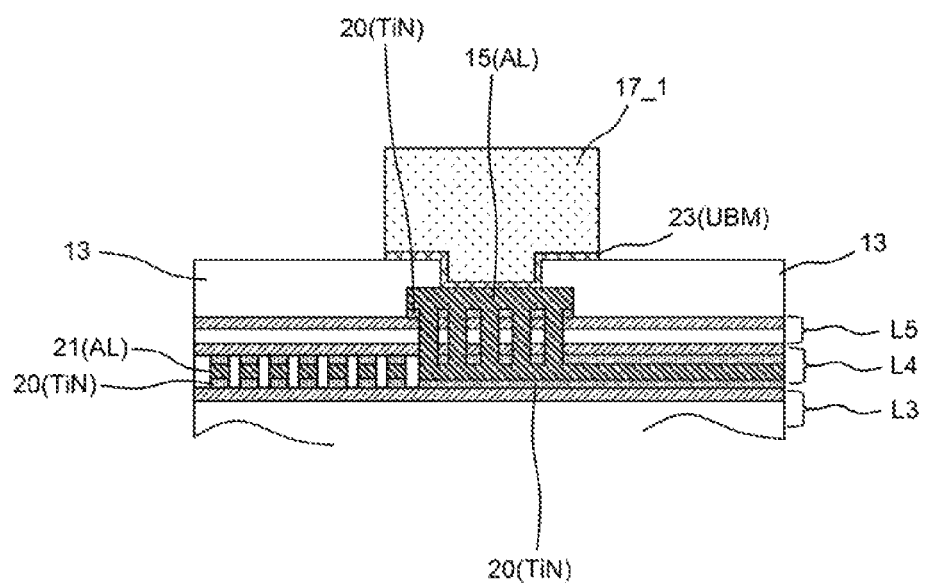
FIG. 15 is a vertical sectional view showing the part of the large scale integrated circuit wafer from which the UBM is removed in the condition shown in FIG. 14.

The external connection terminals 17 are made of a noble metal wiring material and are formed as gold bumps, for example. FIG. 8 shows an example of a part of the large scale integrated circuit wafer before the gold bump is formed. The uppermost-layer wiring 15 is formed as an aluminum pad. The reference numeral 21 denotes an aluminum wiring of a wiring layer L4. The reference numeral 20 denotes a barrier metal that is formed on upper and back surfaces of the aluminum wiring 21 and that is made of TiN, and the barrier metal 20 prevents deterioration due to corrosion of aluminum. The surface of the large scale integrated circuit wafer in the condition shown in FIG. 8 is sputtered with an under-bump metal (UBM) 23 (FIG. 9). Then, a photoresist 30 is coated on the UBM 23 (FIG. 10), and the surface of the photoresist 30 is exposed by using a photo mask 31 (FIG. 11). The photoresist 30 is developed after the exposure, whereby an opening 32 is formed at an unexposed part (FIG. 12). Next, gold plating is performed on the opening 32 by using the remaining photoresist 30 as a mask (FIG. 13). Then, the remaining photoresist 30 is removed (FIG. 14), and the exposed UBM 23 is removed (FIG. 15). Thus, the external connection terminal 17 is formed of a gold bump. The external connection terminal 17 formed of the gold bump has a thickness of 10 to 12 μm, and the wirings such as the uppermost-layer wiring 15 and the closed-circuit wirings 12_1 to 12_6 under the external connection terminal 17 have thicknesses of several thousands angstrom. As is clear from the above descriptions, the conductive vias 18 and 19 can also be formed in a partial step of producing the gold bump.

The large scale integrated circuit wafer 7 thus formed has a structure in which signals, power source, etc. can be commonly supplied from one of the test pads 4 to the plurality of chip forming regions 1*w* that are arranged in parallel. That is, the two predetermined external connection terminals 17_1 and 17_*n* having the same function conduct to each other in the corresponding chip forming region 1*w*, as exemplified in FIG. 5. Accordingly, signals or power source can be commonly supplied from one test pad 4 to the predetermined external connection terminals 17_1 and 17_*n* in the plurality of chip forming regions 1*w*, which are arranged in parallel so that the dicing regions 8 is interposed between each two of the chip forming regions 1*w*. Thus, the number of terminals of test probes, which are to be pushed against the test pads on a wafer before the wafer is diced, is reduced. In other words, increase in the number of the terminals of the test probes is avoided regardless of increase in the number of the external connection terminals in one chip forming region 1*w*. Moreover, conduction of the external connection terminals 17_1 and 17_*n* in the chip forming region 1*w*, as shown in FIG. 5, allows reduction in the number and the length of the test lead-out wirings that are to be arranged in the dicing regions.

Furthermore, the large scale integrated circuit wafer thus formed has a structure in which the uppermost-layer wiring 15 within the guard ring 14 is separated from the test lead-out wiring 6 outside the guard ring 14 by the guard ring 14. That is, one side of the external connection terminal 17_1, which extends over the guard ring 14, connects to the test lead-out wiring 6, and the other side of the external connection terminal 17_1 connects to the uppermost-layer wiring 15 within the guard ring 14. Thus, forming a cutout part at a part of the guard ring 14 is not necessary. Accordingly, the moisture-proof performance of the guard ring 14 is not degraded even though the conductive piece 6 of the test lead-out wiring extending to the inside of the semiconductor circuit 11 is exposed at a cut surface that is made by dicing or at another part in the large scale integrated circuit chip 1 having been subjected to dicing. As exemplified in FIG. 3, moisture and chlorine ions entering along the exposed conductive piece 6 are blocked off by the guard ring 14 and are prevented from entering within the guard ring 14. The conductive via 19 and the external connection terminal 17_1, which connect to the conductive piece 6, are formed of the gold bumps and are thereby not easily corroded. Thus, even when contamination develops to the conductive piece 6 at the outside of the guard ring, the conductive via 19 and the external connection terminal 17_1, which are made of the noble metal wiring material, are not greatly affected, and the moisture-proof performance is still maintained.

Figure 16:
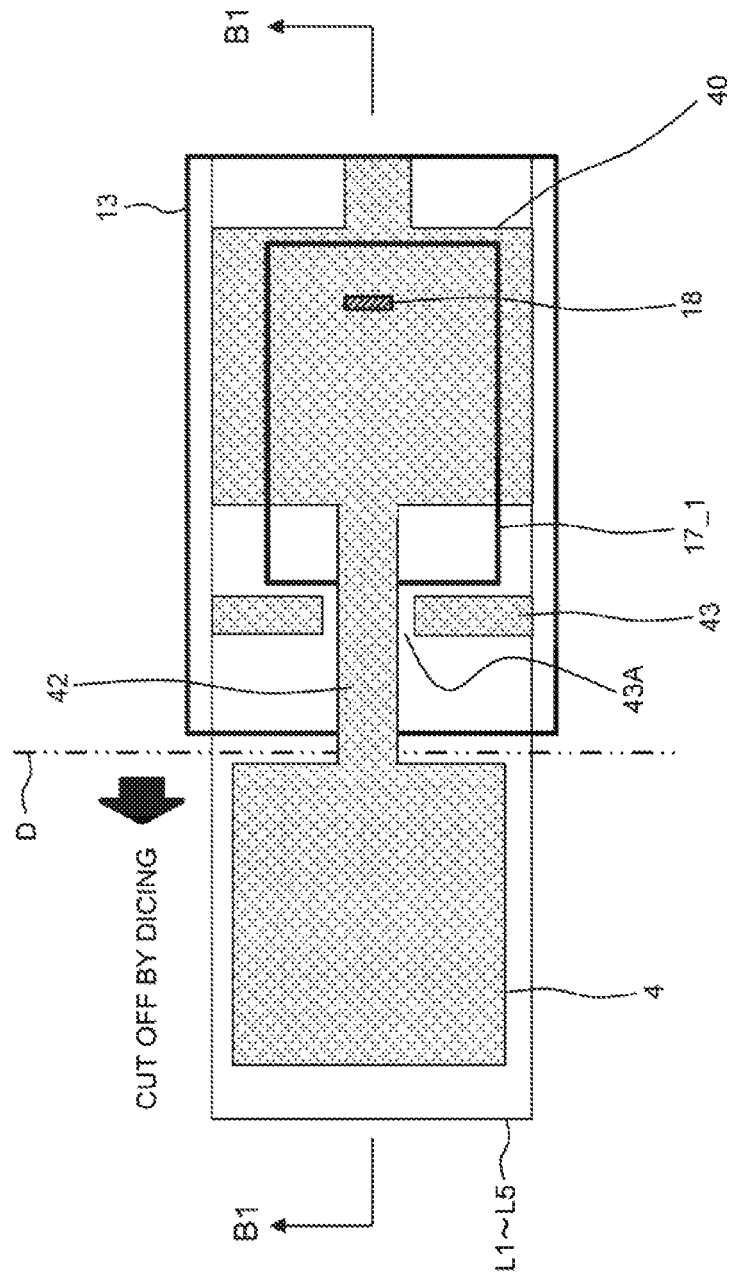
FIG. 16 is a plan view showing a comparative example in which a test lead-out wiring outside a guard ring connects to an uppermost-layer wiring within the guard ring through a cutout part of the guard ring.
Figure 17:
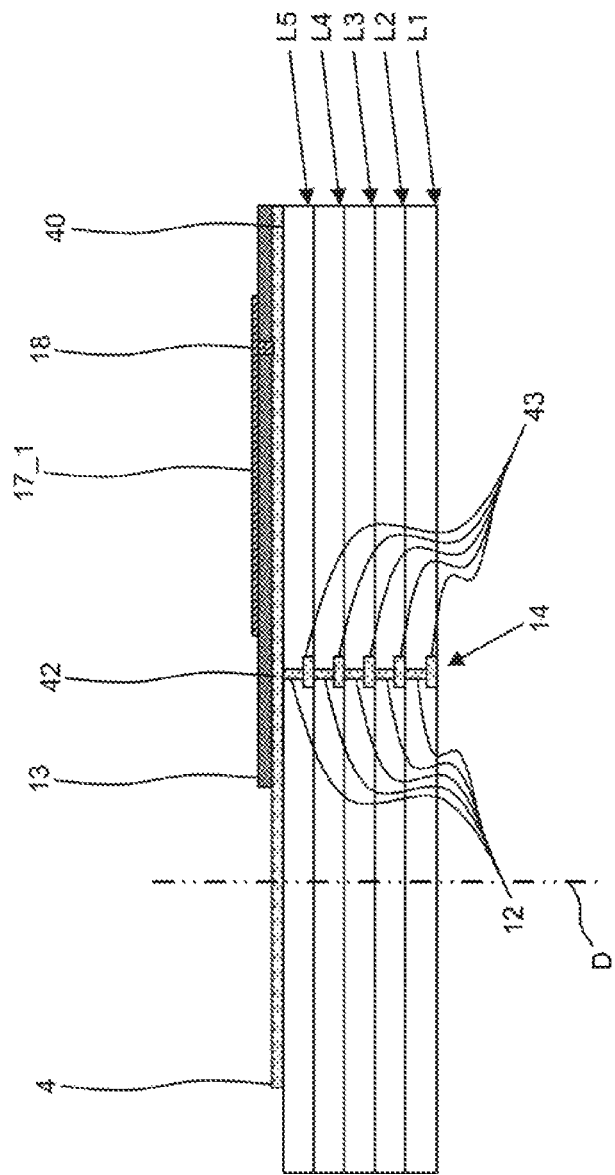
FIG. 17 is a sectional view taken along a line B1-B1 in FIG. 16.
Figure 18:
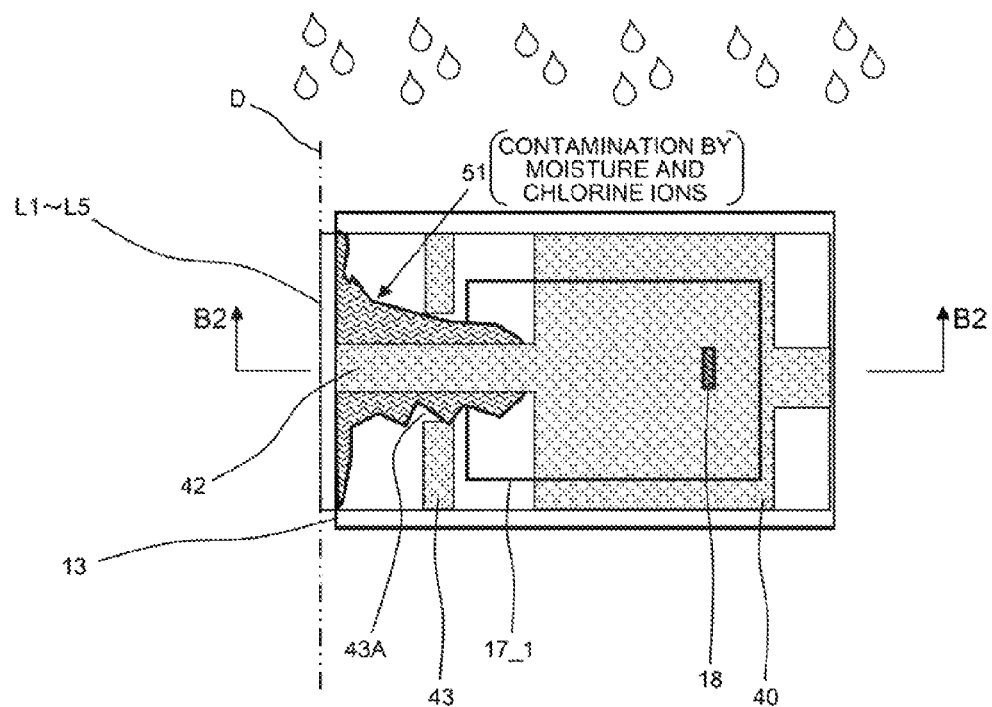
FIG. 18 is a plan view showing the test lead-out wiring that is exposed at a side surface of a chip by dicing from the condition shown in FIG. 16.
Figure 19:
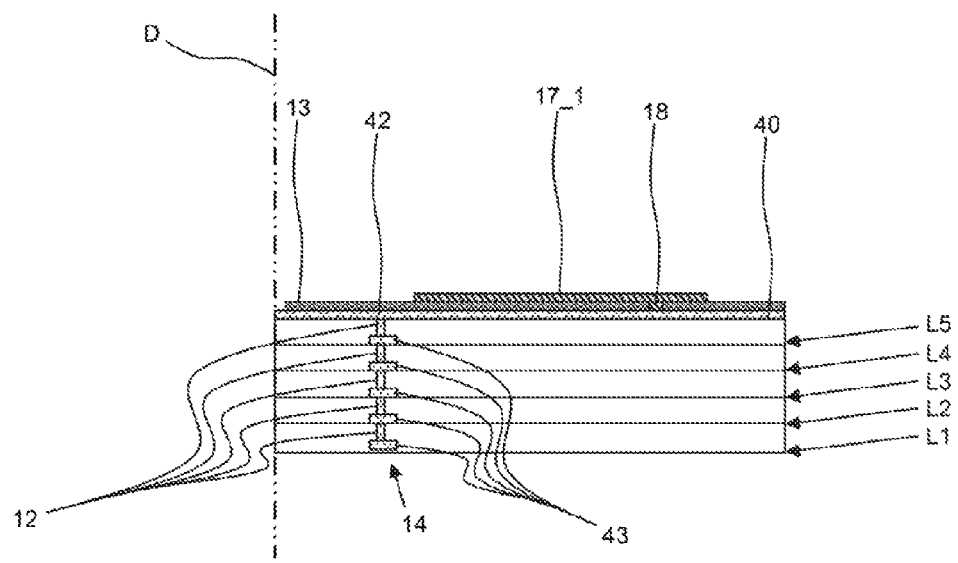
FIG. 19 is a sectional view taken along a line B2-B2 in FIG. 18.

On the other hand, in a comparative example shown in FIGS. 16 and 17, a test lead-out wiring 42 outside a guard ring 43 connects through a cutout part 43A of the guard ring 43 to an uppermost-layer wiring 40 within the guard ring 43. In this case, moisture and chlorine ions entering along the conductive piece 42 that is exposed by dicing, enter within the guard ring 14 through the cutout part 43A, as shown in FIGS. 18 and 19. Thus, although the conductive via 18 and the external connection terminal 17_1 are formed of the gold bumps, contamination of the uppermost-layer wiring 40 underlying the conductive via 18 and the external connection terminal 17_1 can cause unstable conduction between the external connection terminal 17_1 and the uppermost-layer wiring 40, and the other parts can be damaged by corrosion that develops.

As exemplified in FIG. 1, the test lead-out wiring (conductive piece) 6 enters into the indent part 14A that inwardly indents from the outside to the inside of the guard ring 14. Thus, the conductive via 19 can be formed without the need for extending the external connection terminal 17_1 to the outside of the guard ring 14 in a plan view.

Although certain embodiments are specifically described above, the disclosure is not limited to these embodiments, and various changes and modifications can be made within the scope not departing from the gist of the disclosure.

For example, the test pad is arranged in the dicing region that faces the short side of the chip forming region with the long shape in the above descriptions, but the disclosure is not limited to this embodiment. That is, another embodiment comprises a test pad arranged in a dicing region that faces a long side of a chip forming region and connects to the inside of a guard ring in a chip forming region, and moreover, the disclosure can also be applied in a case of performing both of such embodiments. Additionally, the external connection terminal to which the disclosure is applied is not limited to one that is used for power source or ground and may be one that is used for any signals or any electric voltages, such as data, address, control signal, or reference voltage.

The noble metal wiring material is not limited to gold and may be platinum. The aluminum wiring material may be substituted with one of various kinds of wiring materials such as copper wiring materials and silicides. The number of the layers in the multilayered wiring structure is not limited to five and may be another number.

Additionally, the conductive vias 18 and 19 may not necessarily be made of noble metals and may be made by using an aluminum wiring material.

What is claimed is:
1. An integrated circuit chip comprising:
   a semiconductor substrate;
   a semiconductor circuit formed above the semiconductor substrate and having a vertically multilayered wiring structure;

a metal guard ring formed above the semiconductor substrate and surrounding the semiconductor circuit; and
a plurality of external connection terminals connected to a predetermined wiring of the multilayered wiring structure of the semiconductor circuit, and exposed on a surface of the integrated circuit chip,
wherein a first predetermined external connection terminal of the plurality of external connection terminals conducts to the predetermined wiring through a conductive via within the metal guard ring and conducts to a conductive piece through another conductive via outside the metal guard ring, a second predetermined external connection terminal of the plurality of external connection terminals is communicatively coupled to the first predetermined external connection terminal within an internal region of the integrated circuit chip, and the first predetermined external connection terminal and the second predetermined external connection terminal having a common function, and
wherein the conductive piece is a piece of a test lead-out wiring and is a wiring having a cut surface that is exposed by dicing.

2. The integrated circuit chip according to claim 1, wherein the external connection terminals are made of a noble metal wiring material, and the conductive piece and the metal guard ring are made of an aluminum wiring material.

3. The integrated circuit chip according to claim 1, wherein the conductive piece enters into an indent part of the metal guard ring that inwardly indents from the outside to an inside of the metal guard ring and connects to the first predetermined external connection terminal through the other conductive via at a position overlapping the predetermined external connection terminal in a vertical direction.

4. The integrated circuit chip according to claim 1, wherein the conductive piece is a wiring that extends from a test pad formed in a dicing region having been subjected to dicing.

5. The integrated circuit chip according to claim 1, wherein the metal guard ring is formed of closed-circuit wirings and conductive circumferential vias, wherein the closed-circuit wirings form closed circuits and are arranged at respective wiring layers of the multilayered wiring structure overlappingly in a vertical direction so as to surround an outside of the semiconductor circuit, and wherein the circumferential vias vertically and mutually connect the closed-circuit wirings of the wiring layers, which are adjacent to each other in the vertical direction.

6. An integrated circuit wafer comprising:
a semiconductor wafer;
a plurality of chip forming regions arranged on the semiconductor wafer so as to be mutually separated,
wherein each of the plurality of chip forming regions includes:
 a semiconductor circuit formed above the semiconductor wafer and having a vertically multilayered wiring structure;
 a metal guard ring formed above the semiconductor wafer and surrounds the semiconductor circuit; and
 a plurality of external connection terminals connected to predetermined wiring of the multilayered wiring structure of the semiconductor circuit, exposed on a surface of the integrated circuit wafer, and comprising:
  a first predetermined external connection terminal conducting to the predetermined wiring through a first conductive via within the metal guard ring, and connecting to test lead-out wiring through a second conductive via outside the metal guard ring; and
  a second predetermined external connection terminal communicatively coupled with the first predetermined external connection terminal, and having a common function with the first predetermined external connection; and,
dicing regions formed between the plurality of chip forming regions, wherein the dicing regions have a plurality of test pads, wherein the test lead-out wiring is drawn out from the plurality of test pads.

7. The integrated circuit wafer according to claim 6, wherein the external connection terminals are made of a noble metal wiring material, and the metal guard rings are made of an aluminum wiring material.

8. The integrated circuit wafer according to claim 6, wherein:
at least three chip forming regions of the plurality of chip forming regions are arranged along one direction;
each of the dicing regions is interposed between respective chip forming regions on the semiconductor wafer;
the test lead-out wiring is drawn out from each of the plurality of test pads; and
each of the plurality of test pads is formed in one of the dicing regions between adjacent ones of the plurality of chip forming regions, and wherein each of the plurality of test pads connects to one of the predetermined external connection terminals of a corresponding chip forming region.

9. The integrated circuit wafer according to claim 6, wherein the first and second predetermined external connection terminals are power source terminals or ground terminals.

10. The large male integrated circuit wafer according to claim 6, wherein the test lead-out wiring enters into an indent part of the metal guard ring that inwardly indents from the outside to an inside of the metal guard ring and connects to the first predetermined external connection terminal through the conductive via at a position overlapping the first predetermined external connection terminal in a vertical direction.

11. The integrated circuit wafer according to claim 6, wherein the metal guard ring is formed of closed-circuit wirings and conductive circumferential vias, wherein the closed-circuit wirings form closed circuits and are arranged at respective wiring layers of the multilayered wiring structure overlappingly in a vertical direction so as to surround an outside of the semiconductor circuit, and wherein the circumferential vias vertically and mutually connect the closed-circuit wirings of the wiring layers, which are adjacent to each other in the vertical direction.

12. The integrated circuit chip according to claim 1, wherein the second predetermined external connection terminal is communicatively coupled to the first predetermined external connection terminal and no other external connection terminals of the plurality of external connection terminals.

13. The integrated circuit wafer according to claim 6, wherein the second predetermined external connection terminal conducts to the predetermined wiring through a third conductive via within the metal guard ring, and connects to a second test lead-out wiring through a fourth conductive via outside the metal guard ring, the second test lead-out wiring is coupled with a second test pad of the plurality of test pads.

14. The integrated circuit wafer according to claim 8, wherein each of the plurality of the chip forming regions comprises a long side and a short side, and each of the plurality of test pads is disposed adjacent to the short side of at least one of the plurality of the chip forming regions.

15. A method for testing and dicing integrated circuit chips, the method comprising:
applying a test signal to a first test pad of a plurality of test pads, the first test pad is coupled to a first predetermined external connection terminal of a plurality of predetermined external connection terminals of a first chip region of a plurality of chip regions via test-lead out wiring, wherein the plurality of chip regions are arranged on a semiconductor wafer, and the first chip region comprises:
a semiconductor circuit formed on the semiconductor wafer and having a vertically multilayered wiring structure; and
a metal guard ring formed above the semiconductor wafer and surrounds the semiconductor circuit;
wherein the plurality of external connection terminals is connected to predetermined wiring of the multilayered wiring structure of the semiconductor circuit and are exposed on a surface of the first chip region, the first predetermined external connection terminal conducts to the predetermined wiring through a first conductive via inward the metal guard ring, and connects to the test lead-out wiring through a second conductive via outward the metal guard ring, and the first predetermined external connection terminal is coupled to and shares a function with a second predetermined external connection terminal of the plurality of external connection terminals; and
dicing the plurality of chip regions through the test-lead out wiring at dicing regions formed between each of the plurality of chip regions after the test signal has been removed from the first test pad, wherein the plurality of test pads are disposed within the dicing regions.

16. The method of claim 15, wherein the second predetermined external connection terminal is coupled with a second test pad of the plurality of test pads, the second test pad is coupled with a first predetermined external connection terminal of a second plurality of external connection terminals of a second chip region of the plurality of chip regions, and the first predetermined external connection terminal of the first chip region couples the test signal applied at the first test pad to the first predetermined external connection terminal of the second chip region via the second predetermined external connection of the first chip region and the second test pad.

17. The method of claim 15, further comprising determining a functionality of each chip region of the plurality of chip regions based on the test signal.

18. The method of claim 15, wherein applying the test signal comprises applying one of a power source signal and a ground signal to the first test pad.

19. The method of claim 15, wherein the external connection terminals are made of a noble metal wiring material, and the metal guard ring is made of an aluminum wiring material.

20. The method of claim 15, wherein the first test pad enters into an indent part that inwardly indents from the outside to an inside of the metal guard ring and connects to the first predetermined external connection terminal through the other conductive via at a position overlapping the first predetermined external connection terminal in a vertical direction.

* * * * *

UNITED STATES PATENT AND TRADEMARK OFFICE
CERTIFICATE OF CORRECTION

PATENT NO. : 10,026,699 B2  
APPLICATION NO. : 15/442207  
DATED : July 17, 2018  
INVENTOR(S) : Atsushi Obuchi et al.

Page 1 of 1

It is certified that error appears in the above-identified patent and that said Letters Patent is hereby corrected as shown below:

In the Claims

Column 11, Line 60, In Claim 6, after "circuit;" delete "and".

Column 12, Line 9, In Claim 6, delete "and," and insert -- and --, therefor.

Column 12, Line 37, In Claim 10, after "The" delete "large male".

Signed and Sealed this
Twenty-fifth Day of June, 2019

Andrei Iancu
*Director of the United States Patent and Trademark Office*